(12) United States Patent
Luo

(10) Patent No.: US 6,778,016 B2
(45) Date of Patent: Aug. 17, 2004

(54) SIMPLE SELF-BIASED CASCODE AMPLIFIER CIRCUIT

(75) Inventor: Sifen Luo, Potomac, MD (US)

(73) Assignee: Koninklijke Philips Eletronics N.V., Eindhoven (NL)

( * ) Notice: Subject to any disclaimer, the term of this patent is extended or adjusted under 35 U.S.C. 154(b) by 0 days.

(21) Appl. No.: 10/287,199

(22) Filed: Nov. 4, 2002

(65) Prior Publication Data

US 2004/0085130 A1 May 6, 2004

(51) Int. Cl.[7] .................................................. H03F 3/04
(52) U.S. Cl. ........................ 330/288; 330/296; 330/311
(58) Field of Search ................................ 330/288, 296, 330/311

(56) References Cited

U.S. PATENT DOCUMENTS

| 4,663,599 | A | * | 5/1987 | Patch | 330/311 |
|---|---|---|---|---|---|
| 5,359,296 | A | * | 10/1994 | Brooks et al. | 330/288 |
| 5,488,382 | A | | 1/1996 | Fenzi et al. | 343/700 |
| 5,923,217 | A | * | 7/1999 | Durec | 330/288 |
| 6,292,060 | B1 | | 9/2001 | Yeo et al. | 330/302 |

* cited by examiner

Primary Examiner—Khanh Van Nguyen

(57) ABSTRACT

A self-biased cascade amplifier circuit includes first and second transistors connected in series and coupled between a dc voltage source terminal and a common terminal. An input signal terminal is coupled to a control electrode of the first transistor, and an output signal terminal is coupled to an output terminal of the second transistor. An integrated bias circuit is coupled between the dc voltage source terminal and the common terminal for internally biasing both the first and the second transistors without the use of an external bias supply or a direct bias connection to the dc voltage source. This arrangement provides a fully self-biased cascode amplifier circuit having improved performance and a simple and compact configuration.

5 Claims, 1 Drawing Sheet

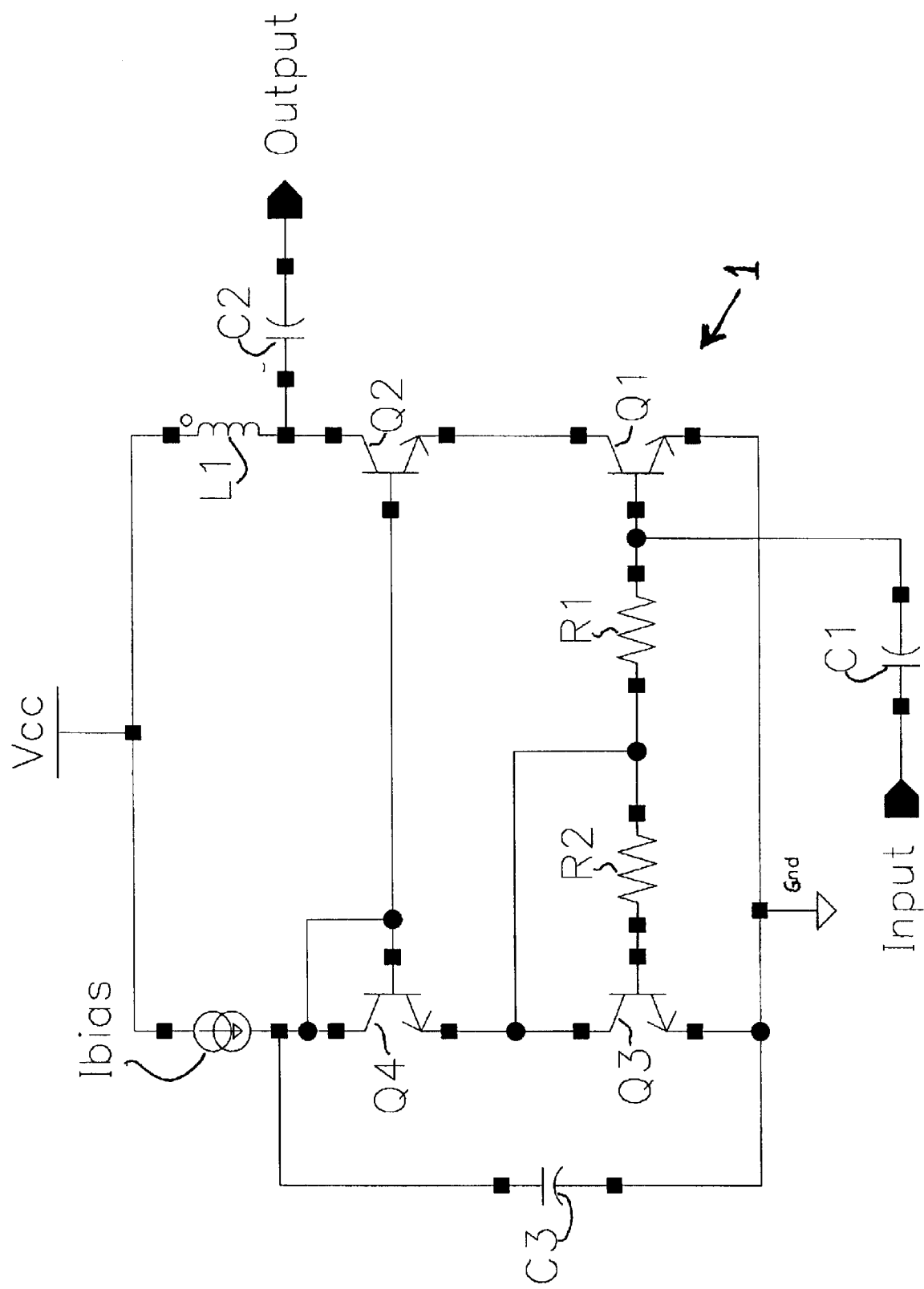

SIMPLE SELF-BIASED CASCODE AMPLIFIER CIRCUIT

FIELD OF THE INVENTION

The invention is in the field of transistor amplifier circuits and relates more particularly to cascode amplifier circuits suitable for use in such applications as rf power amplification.

BACKGROUND OF THE INVENTION

Cascode amplifiers are used in wireless communications apparatus and other rf amplifier applications due to their increased output resistance and reduced unwanted capacitive feedback. However, typical conventional cascode amplifiers require the use of two bias circuits, one for the common-emitter (or source) transistor and the other for the common-base (or gate) transistor (depending upon whether bipolar or FET transistors are used).

Cascode amplifier circuits have sought to overcome this disadvantage using either a resistive network, as shown in U.S. Pat. No. 5,488,382, or else have provided a gate bias to the common-gate transistor by a direct connection to a power supply terminal, as shown in U.S. Pat. No. 6,292,060. However, these prior-art solutions are not optimum in that additional resistors usually require greater chip area than do active devices, and in that obtaining a control electrode bias directly from the power supply voltage puts operational limitations on the amplifier.

Accordingly, it would be desirable to have a self-biased cascode amplifier circuit in which the use of resistor networks to obtain bias signals is minimized, and in which operational flexibility is obtained by not supplying the bias voltage directly from the power supply.

SUMMARY OF THE INVENTION

Objects of the invention are therefore to provide a self-biased cascode amplifier circuit in which no external bias supplies are used, the use of resistor networks is minimized, and operational flexibility is achieved by not providing a bias voltage directly from the power supply, thus realizing a simple, compact, efficient and economical circuit.

In accordance with the invention, these objects are achieved by a new self-biased cascode amplifier circuit having first and second transistors connected in series and coupled between a dc voltage source terminal and a common terminal, with an input signal terminal being coupled to a control electrode of the first transistor and an output signal terminal coupled to an output terminal of the second transistor. An integrated bias circuit is coupled between the dc voltage source terminal and the common terminal for internally biasing both the first and the second transistors without the use of an external bias supply or a direct bias connection to the dc voltage source.

In a preferred embodiment on the invention, the integrated bias circuit includes third and fourth transistors connected in series and coupled between the dc voltage source terminal and the common terminal.

In a further preferred embodiment of the invention, a control electrode of the third transistor is coupled to the control electrode of the first transistor to form a current mirror.

A fully self-biased cascode amplifier in accordance with the present invention offers significant advantages over prior-art circuits in that no external bias supplies are required, the use of resistor networks is minimized, and greater operational flexibility is obtained by not using the power supply voltage as a direct source of bias voltage.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE shows a simplified schematic diagram of a self-biased cascade amplifier circuit in accordance with the invention.

DESCRIPTION OF THE PREFERRED EMBODIMENTS

A simplified schematic diagram of a self-biased cascode amplifier circuit 1 in accordance with the invention is shown in the single FIGURE of the drawing. The self-biased cascode amplifier circuit includes bipolar transistors Q1 and Q2 in a cascade amplifier configuration coupled between Vcc and a common terminal (Gnd) in series with a pull-up inductor L1 which serves to increase the voltage swing at the collector of Q2. The circuit Output is obtained from the junction between Q2 and L1 through a capacitor C2. Self biasing for both transistors of the cascade amplifier is provided by an integrated bias circuit comprising transistors Q3 and Q4, with these transistors being connected between Vcc and Gnd in series with a current source Ibias. An Input terminal, by which a signal, typically an rf signal in the case of wireless communication applications, is coupled to the base of transistor Q1 by a capacitor C1. Capacitors C1 and C2 act as both DC blocking capacitors and parts of the input and output matching networks.

A bypass capacitor C3 is provided across the series connection of transistors Q3 and Q4 to connect the base of transistor Q2 to ground (Gnd) at signal frequencies. A pair of matched resistors R1 and R2 are used to couple the bases of transistors Q1 and Q3 to form a current mirror, and it is noted that if high isolation at high (i.e. rf) operating frequencies is required between the biasing circuit and the amplifier circuit, an inductor can be provided between R1 and Q1.

In the illustrative embodiment shown, all of the transistors are bipolar transistors, with Q1 being operated in a common-emitter mode and Q2 being operated in a common-base mode. By properly scaling the emitter area ratios between the transistor and resistor pairs, the quiescent current in Q1 and Q2 can be made directly proportional to the value of Ibias for improved bias control.

It should be noted that although the illustrative embodiment shows the use of bipolar transistors, the present invention is not limited to such transistors, but may also be implemented using FET transistors or a combination of both bipolar and FET transistors.

It will be apparent from the foregoing description and the schematic diagram of the FIGURE that the self-biased cascode amplifier in accordance with the present invention offers significant advantages over prior-art circuits in that no external bias supplies are required, the use of resistor networks is minimized, with the entire circuit employing only two resistors, and greater operational flexibility is obtained by not using the fixed power supply voltage directly as a bias source. Thus, the current invention provides a simple, compact, efficient and economical cascode amplifier circuit.

While the invention has been particularly shown and described with reference to a preferred embodiment thereof, it will be understood by those skilled in the art that various changes in form and detail may be made without departing from the spirit or scope of the invention. Thus, for example, the invention may employ different types of transistors or other components and alterations to the circuit configuration may be made to suit particular design requirements.

What is claimed is:

1. A self-biased cascode amplifier circuit comprising first and second transistors connected in series and coupled between a dc voltage source terminal and a common terminal, an input signal terminal coupled to a control electrode of said first transistor, an output signal terminal coupled to an output terminal of said second transistor, and an integrated bias circuit coupled between said dc voltage source terminal and said common terminal for internally biasing both said first and said second transistors without the use of an external bias supply or a direct bias connection to said dc voltage source, wherein said integrated bias circuit comprises third and fourth transistors connected directly in series and coupled between said dc voltage source terminal and said common terminal.

2. A self-biased cascode amplifier circuit as claimed in claim 1, wherein a control electrode of said third transistor is coupled to the control electrode of said first transistor to form a current mirror.

3. A self-biased cascode amplifier circuit as claimed in claim 2, wherein a control electrode of said fourth transistor is coupled to a control electrode of said second transistor.

4. A self-biased cascode amplifier circuit as claimed in claim 3, wherein the control electrode of said fourth transistor is directly connected to the control electrode of said second transistor.

5. A self-biased cascode amplifier circuit as claimed in claim 4, wherein said circuit uses only two resistors, and said resistors comprise the resistive coupling between the control electrodes of said first and third transistors.

* * * * *